United States Patent
Kafafi et al.

(10) Patent No.: US 7,221,088 B2
(45) Date of Patent: May 22, 2007

(54) UNIVERSAL HOST FOR RG OR RGB EMISSION IN ORGANIC LIGHT EMITTING DEVICES

(75) Inventors: Zakya H. Kafafi, Alexandria, VA (US); Lisa C. Picciolo, Silver Spring, MD (US); Hideyuki Murata, Sutton (GB)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 385 days.

(21) Appl. No.: 09/995,736

(22) Filed: Nov. 29, 2001

(65) Prior Publication Data

US 2002/0067124 A1 Jun. 6, 2002

Related U.S. Application Data

(60) Provisional application No. 60/253,717, filed on Nov. 29, 2000.

(51) Int. Cl.
    *H01J 1/63* (2006.01)
(52) U.S. Cl. ..................................... 313/504
(58) Field of Classification Search ............... 313/504, 313/503, 506; 428/690; 427/66
    See application file for complete search history.

(56) References Cited

U.S. PATENT DOCUMENTS

| | | | |
|---|---|---|---|
| 5,294,870 A | | 3/1994 | Tang et al. |
| 5,756,224 A | * | 5/1998 | Borner et al. ............... 428/690 |
| 5,895,692 A | * | 4/1999 | Shirasaki et al. ............ 427/557 |
| 5,935,721 A | * | 8/1999 | Shi et al. ..................... 428/690 |
| 5,989,737 A | * | 11/1999 | Xie et al. .................... 428/690 |
| 6,066,357 A | * | 5/2000 | Tang et al. .................... 427/66 |
| 6,097,147 A | * | 8/2000 | Baldo et al. ................. 313/506 |
| 6,146,715 A | | 11/2000 | Kim et al. |
| 6,214,631 B1 | | 4/2001 | Burrows et al. |
| 6,410,166 B1 | * | 6/2002 | Takahashi et al. ........... 428/690 |
| 6,512,122 B2 | * | 1/2003 | Lin et al. ..................... 548/440 |
| H2084 H | * | 10/2003 | Picciolo et al. ............. 428/690 |

OTHER PUBLICATIONS

Noda, et al., Adv. Mater., 11,283 (1999).*
Murata, et al., Proc. SPIE, 3476,88 (1998).*
Shi, Tang, Doped organic Electroluminescent Devices With Improved Stability, Appl. Phys. Lett. 70(13) Mar. 1997, 1665-1667.
Shoustikov, You, Thompson, Electroluminescence Color Tuning by Dye Doping in Organic Light-Emitting Diodes, Quantum Electronics, Jan./Feb. 1998, 3-13.

* cited by examiner

*Primary Examiner*—Edward J. Glick
*Assistant Examiner*—Anastasia S. Midkiff
(74) *Attorney, Agent, or Firm*—Thomas D. Robbins; John J. Karasek

(57) ABSTRACT

The present invention describes the use of red, green and, if necessary, blue dopants dispersed in a universal host material as the active emitting layer in OLEDs. The universal host is transparent in the visible region, and may be emissive in the blue region when used as the blue emitting species or possesses carrier transport properties. By dispersing the dopants in the universal host, efficient energy transfer from host to guest and/or direct carrier recombination on the dopant takes place resulting in bright red, green or blue emission, depending on the dopant. The resulting spectra are characteristic of the guest molecules.

26 Claims, 1 Drawing Sheet

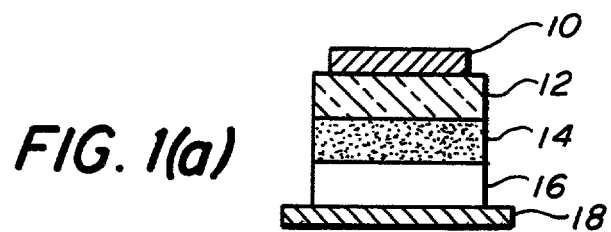
*FIG. 1(a)*
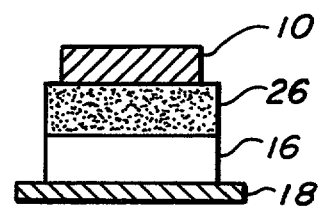
*FIG. 1(b)*
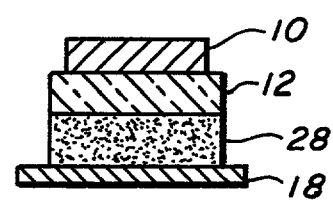
*FIG. 1(c)*
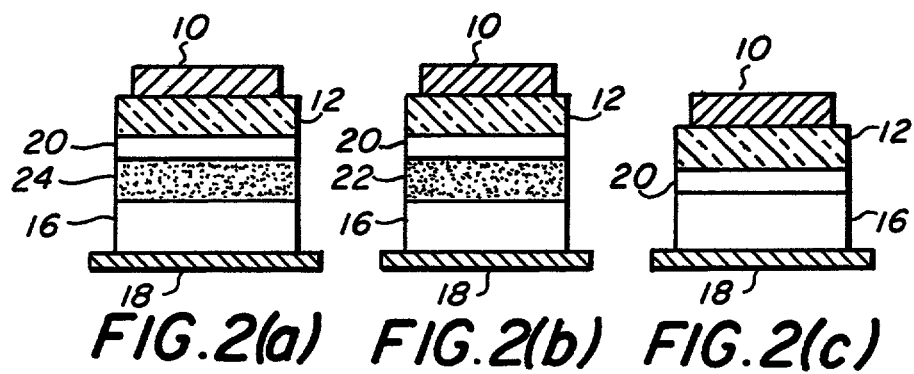
*FIG. 2(a)*  *FIG. 2(b)*  *FIG. 2(c)*

UNIVERSAL HOST FOR RG OR RGB EMISSION IN ORGANIC LIGHT EMITTING DEVICES

RELATED APPLICATIONS

This is a Non-provisional Application relating to a previously filed Provisional Application, PTO No. 60/253,717, filed on Nov. 29, 2000.

BACKGROUND OF THE INVENTION

1. Field of the Invention

This invention relates to colored light emission in light emitting device structures for use in a variety of apparatuses.

2. Description of the Background Art

Organic light emitting devices (OLEDs) are an emerging technology that may soon replace liquid crystal displays (LCDs) in flat panel display applications due to their desirable characteristics including self-emissive high brightness, wide viewing angles, light-weight, and low power consumption. Recently, Sony previewed a prototype of an OLED-based display that is slightly thicker than a credit card and announced production to start in 2003. A display is made up of many tiny individual pixels (picture elements) where, an OLED represents one pixel. In a full-color display, each pixel contains one or all of the three color components, namely, red, green and blue (RGB).

An OLED consists of a transparent substrate, typically glass or plastic, coated with a transparent conducting material, such as Indium Tin oxide (ITO), one or more hole injecting and/or hole transporting layers (HTL), one or more electron transporting (ETL) and/or electron injecting layers and a cathode made up of low work function metals. The HTL or ETL may also have light emissive properties or a separate emitting layer may be sandwiched between the HTL and ETL.

Developing efficient and economical methods to manufacture RGB patterned pixels is one of the main issues concerning the realization of full-color flat panel displays. Several approaches have been developed to achieve full-color organic emissive displays. The first method consists of filtering white light with RGB band-pass filters. This technique results in a large reduction of the optical power from the white OLED. Thus the color-filtered OLEDs must be operated at high brightness/current density, which may accelerate degradation and shorten the lifetime of the device. Another method utilizes the conversion of blue light to green light and red light through a color converting layer comprising a fluorescent material and has been demonstrated with many variations (See U.S. Pat. Nos. 5,126,214; 5,294,870; 6,019,654; 6,023,371; 6,137,221; 6,249,372, all incorporated by reference herein). A major challenge of this method is the difficulty of finding a red fluorescent material with a high absorption coefficient in the blue wavelength region and having a high fluorescence in the red wavelength region. This method also results in reduced device efficiency during the color conversion process.

Yet another method used to achieve RGB emission is through the patterning of discrete RGB sub-pixels. This method has been demonstrated with the use of precise shadow masks (See U.S. Pat. No. 6,214,631, herein incorporated by reference). This patterning method has also been accomplished with a laser ablation technique (See U.S. Pat. No. 6,146,715, herein incorporated by reference) which is used to etch away undesired organic and electrode layers as a way to avoid using harsh photoresist chemicals to pattern discrete RGB pixels adjacent to each other on the same substrate. This approach is more advantageous than the others because the red, green, and blue OLEDs are individually optimized to achieve high device efficiencies at low power. Typically, three different OLED structures are used in order to optimize each color pixel, with a minimum of two different materials (host and dopant) for each of the primary colors. The use of several different types of material components during device fabrication may increase the risk for cross-contamination and would bring about a more complicated process for device fabrication.

Organic electroluminescent devices that include organic host materials and dopants are disclosed, for example, in the following patents and publications, which are all herein incorporated by reference: U.S. Pat. No. 3,172,862 to Gurnee et al; U.S. Pat. No. 3,173,050 to Gurnee; U.S. Pat. No. 3,710,167 to Dresner et al; U.S. Pat. No. 4,356,429 to Tang; U.S. Pat. No. 4,769,292 to Tang et al; U.S. Pat. No. 5,059,863; U.S. Pat. No. 5,126,214 to Tokailin et al; U.S. Pat. No. 5,382,477 to Saito et al; U.S. Pat. No. 5,409,783 to Tang et al; U.S. Pat. No. 5,554,450 to Shi et al; U.S. Pat. No. 5,635,307 to Takeuchi et al; U.S. Pat. No. 5,674,597 to Fujii et al; U.S. Pat. No. 5,709,959 to Adachi et al; U.S. Pat. No. 5,747,183 to Shi et al; U.S. Pat. No. 5,756,224 to Börner et al; U.S. Pat. No. 5,861,219 to Thompson et al; U.S. Pat. No. 5,908,581 to Chen et al; U.S. Pat. No. 5,932,363 to Hu et al; U.S. Pat. No. 5,935,720 to Chen et al; U.S. Pat. No. 5,935,721 to Shi et al; U.S. Pat. No. 5,948,941 to Tamano et al; U.S. Pat. No. 5,989,737 to Xie et al; International Publication No. WO 98/06242 (Forrest et al); C. W. Tang et al "Electroluminescence of Doped Organic Thin Films", J. Appl. Phys. 65(9), May 1969, pp 3610–3616; C. W. Tang and S. A. VanSlyke, "Organic Electroluminescent Diodes", Appl. Phys. Lett. 51(12), Sep. 21, 1987, pp. 913–915; C. W. Tang, "Organic Electroluminescent Materials and Devices" Information Display, October 1996, pp. 16–19; J. Shi and C. W. Tang, "Doped Organic Electroluminescent Devices with Improved Stability", Appl. Phys. Lett 70(13) Mar. 31, 1997, pp. 1665–1667; Shoustikov et al, "Electroluminescence Color Tuning by Dye Doping in Organic Light-Emitting Diodes", IEEE Journal of Selected Topics in Quantum Electronics, Vol. 4, No. 1 January/February 1998, pp 3–13; Baldo et al, "Highly Efficient Phosphorescent Emission from Organic Electroluminescent Devices", Nature, Vol. 395, Sep. 10, 1998, pp 151–153; O'Brien et al "Improved Energy Transfer in Electrophosphorescent Devices", Applied Physics Letters, Vol. 74, No. 3, Jan. 18, 1999, pp. 442–444.

BRIEF SUMMARY OF THE INVENTION

RGB emission can be achieved using universal host/dopant systems as the emitting layer in OLED pixels. This approach allows the display to be easily color tuned by modifying only one element of the device structure, the dopant. The advantage of combining two mechanisms, energy transfer and direct carrier recombination, allows us to use common host materials for different dopants while still maintaining device efficiency and good color chromaticity. In addition, this method minimizes the number of processing steps thus simplifying the device structures and reducing the risk of cross contamination. A new feature of this invention is the use of a universal host for RGB dopants to achieve fall color displays using OLEDs. It is the object of this invention to provide an approach to simplify OLED structures and minimize the number of materials used to achieve RGB color emission. A full-color display utilizing a universal host, as described in this invention, does not rely solely on good spectral overlap between host emission and guest absorption (energy transfer) to achieve red emission. The present invention details several possibilities for the usefulness of this concept. A single universal host can be used for R, G, and B dopants (see FIG. 1(a)). Additionally, if the universal host has blue emissive properties, it can be used undoped to further reduce the number of materials. Likewise, if the universal host has carrier transport properties, the need for additional hole or electron transport materials is eliminated (see FIGS. 1(b) and 1(c)). Another example utilizes the emission properties of either or both of the carrier transport layers to obtain one or more of the RGB pixels, which again reduces the number of materials used in the devices. A specific example of this last method is described in detail below.

BRIEF DESCRIPTION OF THE DRAWINGS

FIG. 1(a) shows an OLED structure and its components: a cathode (10); an electron transport layer (ETL) (12); a doped universal host (14); an hole transport later (HTL) (16); and an anode (18).

FIG. 1(b) shows an OLED structure and its components: a cathode (10); a doped universal host also serving as the ETL (26); an HTL (16), and an anode (18).

FIG. 1(c) shows an OLED structure and its components: a cathode (10); an ETL (12), a doped universal host also serving as the HTL (28), and an anode (18).

FIG. 2(a) shows an example of a structure for a red emitting OLED and its components: a cathode (10); an ETL (12); a hole blocker layer (20); a doped universal host (for emitting red light) (24); an HTL (16); and an anode (18).

FIG. 2(b) shows an example of structure for a green emitting OLED and its components: a cathode (10); an ETL (12); a hole blocker layer (20); a doped universal host (for emitting green light) (22); an HTL (16); and an anode (18).

FIG. 2(c) shows an example of structure for a blue emitting OLED and its components: a cathode (10); an ETL (12); a hole blocker layer (20); an HTL (16) (material selected so as to emit blue light); and an anode (18).

DETAILED DESCRIPTION OF THE INVENTION AND PREFERRED EMBODIMENTS

The present invention describes a new technique of using composite materials consisting of red, green and blue (if necessary) dopants dispersed in a universal host material as the active emitting layer in OLEDs. The universal host is a material that is either transparent in the visible region or may be emissive in the blue region when used additionally as the blue emitting species and/or possesses carrier transport properties. By dispersing the dopants in the universal host, efficient energy transfer from host to guest and/or direct carrier recombination on the dopant takes place resulting in bright red, green or blue emission, depending on the dopant. The resulting spectra are characteristic of the guest molecules.

The present invention describes a new economical and efficient approach to achieve RGB emission using a minimum number of materials and OLED structures. In the instant approach, one organic material serves as the universal host for red, green and blue dopants. This universal host is a material that is either transparent in the visible region or it may be emissive in the blue region. Unless the universal host serves the dual role of host and blue emitter, a high photoluminescence quantum efficiency is only required for the dopants of the host and the universal host is transparent. The host may also possess carrier transport properties, which could further simplify the OLED structures.

The universal host can be used as a pure thin film to achieve blue emission. The universal host may also exist in combination with one of the RGB dopants and used as the emissive layer in OLEDs. When blue or green emitters are doped into the universal host, there is efficient energy transfer from the host material to the dopant and/or carrier recombination on the dopant resulting in electroluminescence predominantly from the dopant. When a red emitter is doped into the universal host, direct carrier recombination is the predominant emission mechanism because there is usually poor spectral overlap of the host emission and the dopant absorbance.

This universal host has many potential applications in opto-electronic devices such as flat panel electronic displays. Such a universal host allows OLED displays to be easily color tuned by modifying the dopant while maximizing the device efficiency. Consequently, the number of materials used and the cost of manufacturing the displays are greatly minimized.

EXAMPLE 1

RGB emission was achieved with a universal host used for RG OLED pixels fabricated with similar device structures, with the exception of the emitting species. The blue emissive properties of the hole transport material, 4,4-bis (1-naphthylphenylamino)biphenyl (NPB) were utilized for the B OLED pixel (see FIG. 1(c)).

OLED RGB device structures and organic materials used in this example are shown in FIGS. 2(a) through 2(c). All materials were vacuum deposited inside a chamber under a base pressure of approximately $10^{-7}$ Torr. All devices contain of a glass substrate coated with a transparent anode material, here indium tin oxide (ITO). In addition, the hole transporting layer in all devices is NPB. The hole blocking layer is bathocuproine (2,9-dimethyl-4,7-diphenyl-1,10-phenanthroline)(BC) in all three devices. Lastly, all devices utilized 5,5'-bis(dimesityl-boryl)-2,2'-bithiophene (BMB-2T), as the electron transport layer.

For the red and green OLED devices (FIGS. 2(a) and 2(b), respectively), a composite film of the universal host material, BMB-2T, and dopant, was inserted between the NPD and BC layers to act as the emitting layer. 6,13-diphenylpentacene (DPP) and N,N'-diethylquinacridone (DEQ), were used as the red and green dopants, respectively. Although BMB-2T can be used as a blue emitting material without any dopant, better chromaticity coordinates can be achieved by using NPB as the blue emitting layer in the blue device (see FIG. 2(c)). The BC layer acts as a hole blocker and thus forces recombination inside the NPB layer. A magnesium and silver alloy was used as the cathode for all of the devices.

EXAMPLE 2

We have also postulated that RGB emission can be readily achieved where the universal host used for RG OLED pixels is fabricated with similar device structures as described above in Example 1. The blue emissive properties of the universal host can be utilized for the B OLED pixel. The devices consist of glass substrate coated with indium tin oxide (ITO), a transparent anode material. For all of the devices, the hole transporting layers are NPB. The electron transport layers are composed of separate layers of o-TTA and 5,5'-bis(dimesitylboryl)-2,2'-bithiophene (BMB-2T). The o-TTA layer also functions to allow for generation and transmittance of blue light because it serves to prevent the formation of an exciplex between the NPB and BMB-2T layers (See Shirota, *J MAT Chem.*, 10, 1–25 (2000), herein incorporated by reference). For the green and red devices, a composite film of the universal host material, BMB-2T, and dopant, would be inserted between the o-TTA and BMB-2T layers to act as the emitting layer. 6,13-diphenylpentacene (DPP) and N,N'-diethylquinacridone (DEQ) can be used as the red and green dopants, respectively. A magnesium and silver alloy would be used as the cathode for all of the devices.

Electroluminescence (EL) spectra were measured inside a glove box purged with dry nitrogen. The luminescence was collected and brought out through an optical fiber. Voltage-current-luminance measurements were performed with a high current source and luminance meter. Device performance was evaluated based on the external quantum efficiency defined as the ratio of the number of emitted photons to the number of injected carriers. Color chromaticity coordinates of the electroluminescence emission were calculated according to the definition developed by the Commission Internationale de L'Éclairage 1931 (CIE 1931). Color chromaticity of RGB emission obtained were highly comparable to those of current cathode ray tube monitors. Direct carrier recombination on the red guest molecules is likely to be the EL mechanism for the significant improvement of the colore chromaticity and the EL efficiency of the present invention. The combination of the two mechanisms, energy transfer and direct carrier recombination, allows the instant invention to utilize the common host materials for different guests.

The EL spectra of RGB devices are also very similar to photoluminescence (FL) spectra characteristic of the pure emitting species. The emission from the red device takes advantage of direct carrier recombination on the red dopant molecules. This emission mechanism does not rely on spectral overlap of the host and dopant as is necessary for Förster energy transfer. Instead, the dopant acts as a carrier trap in the universal host.

We claim:

1. A device comprising:
   a hole transporting layer;
   a host layer comprising an undoped material capable of emitting light at a wavelength in the blue region, said host layer including at least one of a first portion having a red light emitting dopant material therein and a second portion having a green light emitting dopant material therein, said first portion being capable of emitting light at a wavelength in the red region, said second portion being capable of emitting light at a wavelength in the green region;
   an electron transport layer;
   a first electrode; and
   a second electrode,
   wherein said hole transporting layer, said host layer and said electron transport layer are disposed between said first electrode and said second electrode, and
   wherein said first electrode and said second electrode are operable to provide a bias across said hole transporting layer, said host layer and said electron transport layer.

2. The device of claim 1, wherein said red light emitting dopant material comprises 6,13-diphenylpentacene.

3. The device of claim 1, wherein said green light emitting dopant material comprises N,N=-diethylquinacridone.

4. The device of claim 1, wherein said hole transporting layer comprises 4.4-bis(1-naphthylphenyl-amino)biphenyl.

5. The device of claim 1, wherein said electron transport layer comprises 5,5=-bis(dimesitylboryl)-2,2=-bithiophene.

6. The device of claim 1, further comprising:
   a hole blocking layer located between said host layer and said electron transport layer,
   wherein said hole blocking layer is in electrical contact with said host layer.

7. The device of claim 6, wherein said hole blocking layer comprises bathocuproine.

8. A device comprising:
   an electron transport layer;
   a hole transporting layer comprising an undoped material capable of emitting light at a wavelength in the blue region, said hole transporting layer including at least one of a first portion having a red light emitting dopant material therein and a second portion having a green light emitting dopant material therein, said first portion being capable of emitting light at a wavelength in the red region, said second portion being capable of emitting light at a wavelength in the green region;
   a first electrode; and
   a second electrode,
   wherein said hole transporting layer and said electron transport layer are disposed between said first electrode and said second electrode, and
   wherein said first electrode and said second electrode are operable to provide a bias across said hole transporting layer and said electron transport layer.

9. The device of claim 8, wherein said red light emitting dopant material comprises 6,13-diphenylpentacene.

10. The device of claim 8, wherein said green light emitting dopant material comprises N,N=-diethylquinacridone.

11. The device of claim 8, wherein said hole transporting layer comprises 4,4-bis(1-naphthylphenyl-amino)biphenyl.

12. The device of claim 8, wherein said electron transport layer comprises 5,5=-bis(dimesitylboryl)-2,2=-bithiophene.

13. A device comprising:
   a hole transporting layer;
   a host layer including at least one of a first portion having a red light emitting dopant material therein and a second portion having a green light emitting dopant material therein;
   an electron transport layer;
   a first electrode; and
   a second electrode,
   wherein said hole transporting layer, said host layer and said electron transport layer are disposed between said first electrode and said second electrode,
   wherein said first electrode and said second electrode are operable to provide a bias across said hole transporting layer, said host layer and said electron transport layer, and
   wherein said host layer comprises a material having a spectral overlap with said at least one of said first portion having said red light emitting dopant material therein and said second portion having said green light emitting dopant material therein, the spectral overlap enabling energy transfer and direct carrier recombination in said host layer when provided with the bias such that at least one of said first portion having said red light emitting dopant material therein emits light at a wavelength in the red region and said second portion having said green light emitting dopant material therein emits light at a wavelength in the green region.

14. The device of claim 13, wherein said red light emitting dopant material comprises 6,13-diphenylpentacene.

15. The device of claim 13, wherein said green light emitting dopant material comprises N,N=-diethylquinacridone.

16. The device of claim 13, wherein said hole transporting layer comprises 4,4-bis(1-naphthylphenyl-amino)biphenyl.

17. The device of claim 13, wherein said electron transport layer comprises 5.5=-bis(dimesitylboryl)-2,2=-bithiophene.

18. The device of claim 13, further comprising:
a hole blocking layer located between said host layer and said electron transport layer,
wherein said hole blocking layer is in electrical contact with said host layer.

19. The device of claim 18, wherein said hole blocking layer comprises bathocuproine.

20. A device comprising:
a hole transporting layer;
an electron transport layer;
a first electrode; and
a second electrode,
wherein said hole transporting layer and said electron transport layer are disposed between said first electrode and said second electrode.
wherein one of said hole transporting layer and said electron transport layer includes at least one of a first portion having a red light emitting dopant material therein and a second portion having a green light emitting dopant material therein,
wherein said first electrode and said second electrode are operable to provide a bias across said hole transporting layer and said electron transport layer, and
wherein said one of said hole transporting layer and said electron transport layer comprises a material having a spectral overlap with said at least one of said first portion having said red light emitting dopant material therein and said second portion having said green light emitting dopant material therein, the spectral overlap enabling energy transfer and direct carrier recombination in said one of said hole transporting layer and said electron transport layer when provided with the bias such that at least one of said first portion emits light at a wavelength in the red region and said second portion emits light at a wavelength in the green region.

21. The device of claim 2, wherein said electron transport layer comprises a material capable of emitting light at wavelengths in the blue region.

22. The device of claim 20, wherein said red light emitting dopant material comprises 6,13-diphenylpentacene.

23. The device of claim 20, wherein said green light emitting dopant material comprises N,N=-diethylquinacridone.

24. The device of claim 20, wherein said electron transport layer further includes a third portion having a blue light emitting dopant material therein.

25. The device of claim 20, wherein said hole transporting layer comprises 4.4-bis(1-naphthylphenyl-amino)biphenyl.

26. The device of claim 20, wherein said electron transport layer comprises 5,5=-bis(dimesitylboryl )-2.2=-bithiophene.

* * * * *